United States Patent [19]
Kim et al.

[11] Patent Number: 6,048,783
[45] Date of Patent: Apr. 11, 2000

[54] METHOD OF FORMING AN ELECTRODE ON A SUBSTRATE OF A SEMICONDUCTOR DEVICE

[75] Inventors: Hye-Young Kim; Kyo-Hoo Moon, both of Kyoungsangbuk-Do, Rep. of Korea

[73] Assignee: LG. LCD Inc., Rep. of Korea

[21] Appl. No.: 09/282,976

[22] Filed: Mar. 31, 1999

[51] Int. Cl.[7] ................................................ H01L 21/3205
[52] U.S. Cl. .......................................... 438/588; 438/584
[58] Field of Search ................................... 438/588, 592, 438/591, 584; 148/DIG. 33

[56] References Cited

U.S. PATENT DOCUMENTS

| | | |
|---|---|---|
| 4,473,436 | 9/1984 | Beinvogl . |
| 4,718,973 | 1/1988 | Abraham et al. . |
| 4,778,563 | 10/1988 | Stone . |
| 5,110,411 | 5/1992 | Long . |
| 5,115,290 | 5/1992 | Murakami et al. . |
| 5,147,814 | 9/1992 | Takeuchi . |
| 5,821,159 | 10/1998 | Ukita . |

*Primary Examiner*—Charles Bowers
*Assistant Examiner*—Scott J. Hawranek
*Attorney, Agent, or Firm*—Graham & James LLP

[57] ABSTRACT

A double-layered electrode layer is formed on a substrate according to a process in which lower and upper electrode layer forming materials are deposited on a substrate in this order, then a lower photoresist pattern is formed on the upper electrode layer forming material. Next, the lower and upper electrode layer forming materials are isotropically etched to obtain lower and upper electrode layers, after which the upper electrode layer is anisotropically etched such that a width of the upper electrode layer becomes less than that of the lower electrode layer.

22 Claims, 4 Drawing Sheets

METHOD OF FORMING AN ELECTRODE ON A SUBSTRATE OF A SEMICONDUCTOR DEVICE

CROSS REFERENCE TO RELATED ART

This application claims priority of Korean patent application Ser. No. 98-35816 filed on Sep. 1, 1998, the entire disclosure of which is incorporated herein by reference.

BACKGROUND OF THE INVENTION

1. Field of the Invention

The present invention relates to a semiconductor device such as a thin film transistor ("TFT"), more particularly, a method of forming a double-layered electrode on a substrate of a semiconductor device.

2. Description of the Related Art

Generally, a semiconductor device such as a liquid crystal display ("LCD") is made through a plurality of process steps. More particularly, in the case of a TFT LCD, such a semiconductor device is made through even more complicated steps. That is, to make a TFT panel, more then six masking processes are required, and more than four masking processes are required for making a color filter. This results in a total of more than 10 masking processes being required for making the TFT LCD.

A method of reducing the number of required masking processes and preventing a short circuit occurring during a photolithography process has been developed. More particularly, a method of reducing the number of masking processes has been developed in forming an electrode layer on a substrate.

FIGS. 1a to 1e illustrate, in cross-section, a portion of a TFT as it undergoes sequential processing steps for forming an electrode layer.

Referring first to FIG. 1a, an aluminum layer 2 for a gate of a TFT element and a photoresist 3 are deposited on a substrate 1 in this order. Next, as shown in FIG. 1b, the photoresist 3 is developed to have a predetermined pattern 3' through a light exposing process, after which the aluminum layer 2 is etched using the photoresist pattern 3' as a mask. After this step, the patterned photoresist layer 3' is removed, thereby obtaining a lower electrode layer 4.

Following the above steps, as shown in FIG. 1c, a molybdenum layer 6 is deposited on the substrate 1 to cover the lower electrode layer 4, after which a photoresist layer 7 is deposited on the molybdenum layer 6.

The photoresist 7 is developed in a predetermined patterned photoresist 7' such that it corresponds to the lower electrode layer 4 but has a width greater than the lower electrode layer 4. After this step, the molybdenum layer 6 is etched using the patterned photoresist layer 7' as a mask such that an upper electrode layer 8 is formed to cover the lower electrode layer 4 (see FIG. 1d). The patterned photoresist layer 7' is then removed, thereby obtaining a double-layered electrode layer 9 as shown in FIG. 1e.

The double-layered electrode layer 9 has the advantages of preventing the breaking of the electrode layer 9 and preventing abnormal growth of an insulating layer to be deposited thereon, thereby preventing the breakdown of the TFT.

However, in the above described electrode forming method, since two masking processes are required, manufacturing productivity is low.

In an effort to solve this problem, a method for simultaneously etching two gate metal layers has been developed.

Describing more in detail with reference to FIGS. 2a to 2c, an aluminum layer 10 and a molybdenum layer 11 are first deposited on a substrate 1 in this order, after which a photoresist 12 is deposited on the molybdenum layer 11 (see FIG. 2a).

Next, the photoresist 12 is developed in a predetermined pattern 13, then the molybdenum layer 11 and the aluminum layer 10 are simultaneously etched by a mixed acid-based etching solution while using the patterned photoresist 13 as a mask, thereby obtaining upper and lower electrode layers 14 and 15 (see FIG. 2b). This method is advantageous in that the number of masking processes is reduced.

However, in this method, since the aluminum layer 10 has a relatively large etch rate, the amount of the side etch of the aluminum layer 10 becomes larger than that of the molybdenum layer 11. Therefore, the upper electrode layer 14 formed of the aluminum layer 10 has a section having a width which is increasingly enlarged in a downward direction, while a width of the upper electrode layer 14 formed of the molybdenum layer 11 becomes larger than that of the lower electrode layer 15, thereby forming an overhang 16. Then the photoresist 13 is removed and an insulating layer is deposited on the upper electrode layer 14.

As shown in FIG. 2c, the overhang 16 causes insufficient covering of the dual-layered electrode 14 and 15 by the insulating layer 17. That is, a void 19 may be formed between the lower electrode layer 15 and the insulating layer 17.

Japanese Laid-Open Patent Publication Nos. S63-077086 and H04-213427 disclose methods for solving the overhang problem. However, these methods also require many etching steps.

SUMMARY OF THE INVENTION

In order to solve the above problems, preferred embodiments of the present invention provide a method for forming a double-layered electrode in which the number of etching steps is reduced, while preventing an overhang condition.

According to one preferred embodiment of the present invention, a method for forming a double-layered electrode on a substrate includes the steps of depositing lower and upper electrode layer forming materials on the substrate in order, forming a patterned photoresist layer on the upper electrode layer forming material, isotropically etching the lower and upper electrode layer forming materials, thereby obtaining lower and upper electrode layers, removing the patterned photoresist layer, and anisotropically etching the upper electrode layer such that a width of the upper electrode layer becomes less than that of the lower electrode layer.

The lower electrode layer forming material is preferably aluminum or an aluminum alloy, while the upper electrode layer forming material is preferably selected from the group consisting of Mo, Ta, W and Sb.

Preferably, the isotropic etching step is performed using an acidic aqueous solution including acetic acid, phosphoric acid, and nitric acid.

The removing step for photoresist is performed preferably using an $O_2$ gas. However, other suitable gases for removing the photoresist may also be used.

Preferably, the anisotropic etching step is done using an $SF_6$ gas.

Preferably, a flow rate of the $O_2$ gas is about 50–175 sccm, while that of the $SF_6$ gas is about 200–600 sccm.

The method may further comprise, after the step of forming a patterned photoresist layer, the step of heating the patterned photoresist layer such that a section of the patterned photoresist becomes substantially hemispherical.

According to another preferred embodiment of the present invention, a method includes the steps of depositing lower and upper electrode layer forming materials on the substrate in order, forming a patterned photoresist layer on the upper electrode layer forming material, wet etching the lower and upper electrode layer forming materials simultaneously, thereby obtaining lower and upper electrode layers, removing the patterned photoresist layer, and dry etching the upper electrode layer such that a width of the upper electrode layer becomes less than that of the lower electrode layer.

BRIEF DESCRIPTION OF THE DRAWINGS

Further objects and other advantages of the present invention will become apparent from the following description of preferred embodiments thereof in conjunction with the attached drawings, in which.

DETAILED DESCRIPTION OF PREFERRED EMBODIMENTS

Preferred embodiments of the present invention will now be described in detail with reference to the accompanying drawings.

Figure 1A:
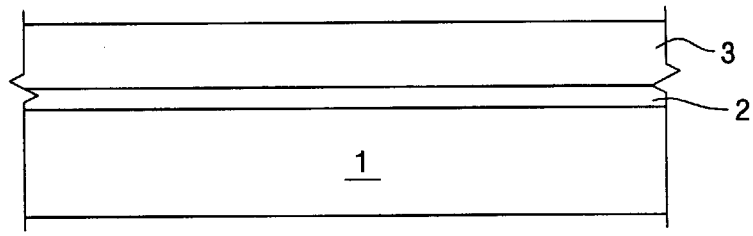
FIGS. 1a to 1e illustrate, in cross-section, a portion of a semiconductor device as it undergoes sequential processing steps for forming a double-layered electrode on a substrate.
Figure 1B:
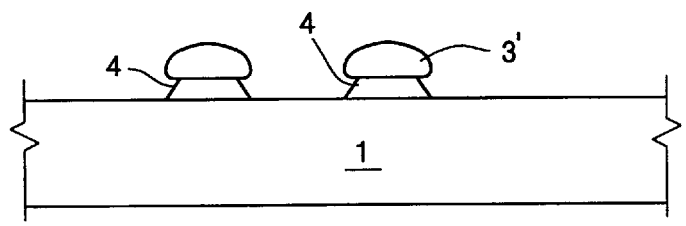
Figure 1C:
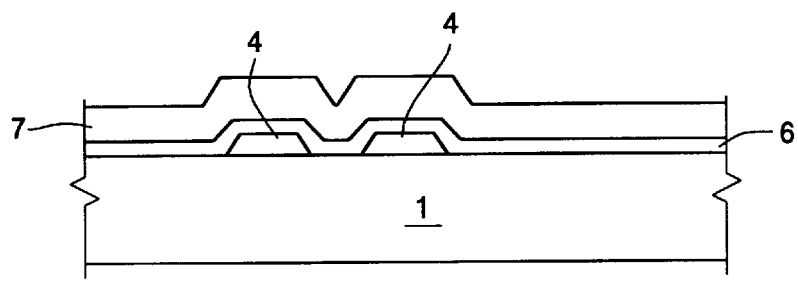
Figure 1D:
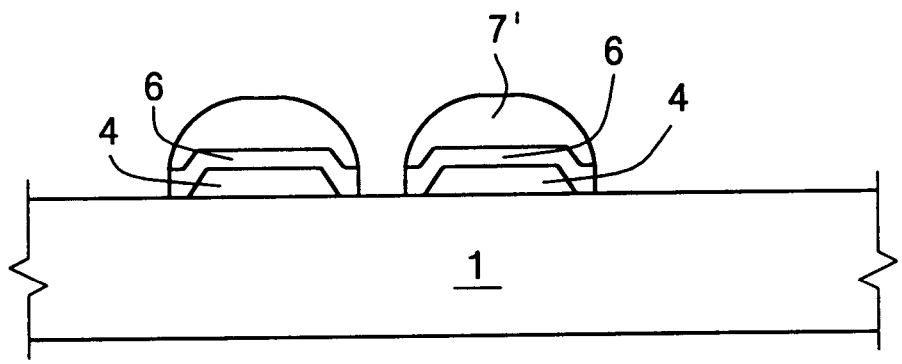
Figure 1E:
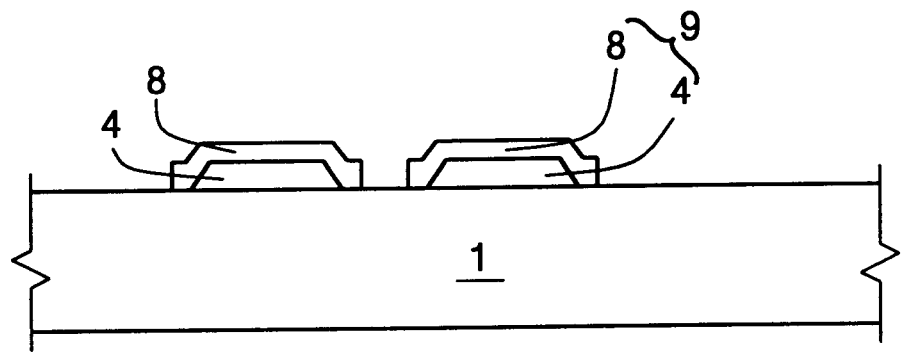
Figure 2A:
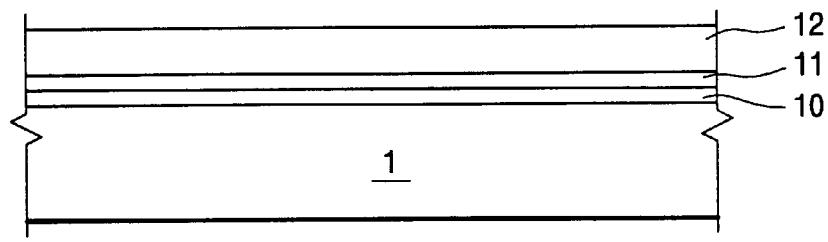
FIGS. 2a to 2c illustrate, in sectional views, a conventional semiconductor device in which an insulating layer is deposited on a double-layered electrode.
Figure 2B:
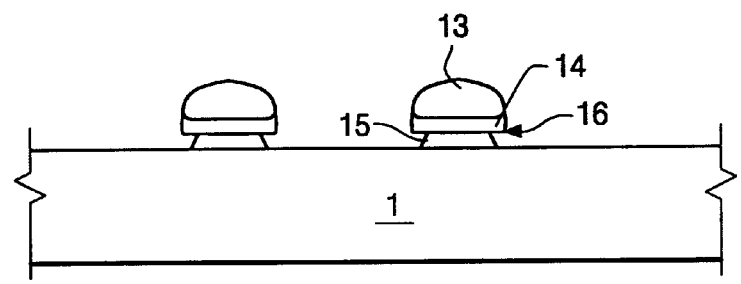
Figure 2C:
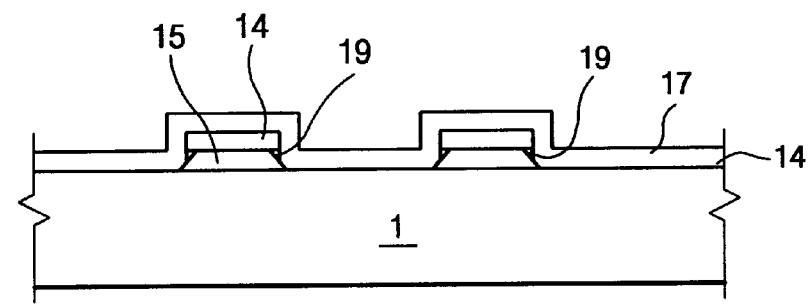
Figure 3A:
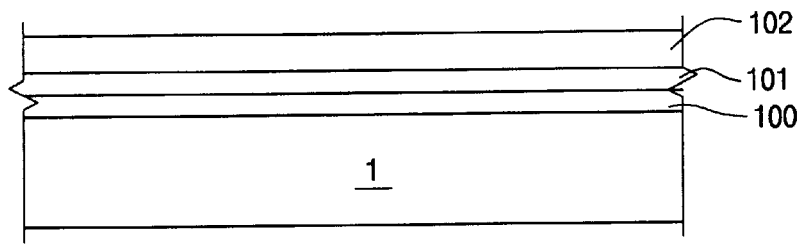
FIGS. 3a to 3c illustrate, in cross-section, a portion of a semiconductor device as it undergoes sequential processing steps for forming a double-layered electrode on a substrate according to a preferred embodiment of the present invention.
Figure 3B:
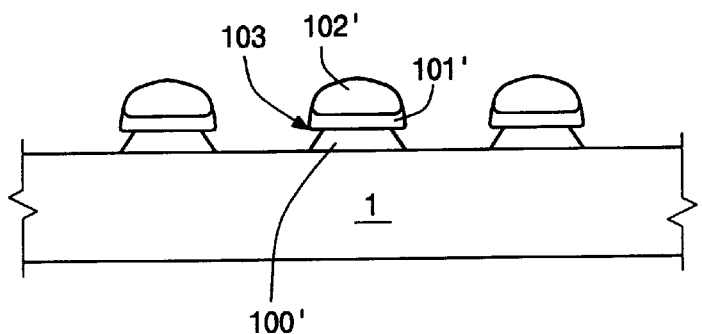
Figure 3C:
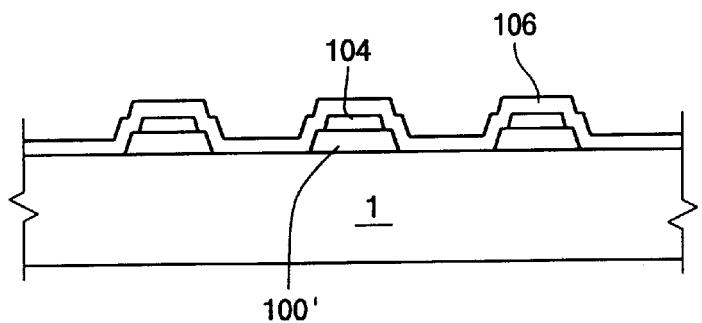

FIGS. 3a to 3c illustrate, in cross-section, a portion of a semiconductor device as it undergoes sequential processing steps for forming a step-shaped double-layered electrode on a substrate.

Referring first to FIG. 3a, a lower metal layer such as an Al alloy layer 100 is deposited on a substrate 1, after which a upper metal layer 101 having a high melting point such as Mo, Ta, W or Sb is deposited on the lower metal layer 100. A photoresist 102 is then deposited on the upper metal layer 100.

Following the above steps, as shown in FIG. 3b, the photoresist 102 is exposed to light to develop the same such that a patterned photoresist 102' can be formed. Preferably, the patterned photoresist layer 102' is formed having a hemispherical section obtained through a heating-process. After this step, the lower and upper metal layers 100 and 101 are simultaneously etched through a wet-etching process while using the hemispherical patterned photoresist layer 102' as a mask, thereby obtaining lower and upper gate patterns 100' and 101'.

At this point, an acidic aqueous solution including acetic acid, phosphoric acid, and nitric acid is preferably used as an etching solution.

In addition, the etching process is isotropically conducted so that side walls of the layers 100' and 101' are inclined, each having a tapered section.

In addition, as an etch rate of the lower metal layer 100 made of the aluminum alloy is greater than that of the upper metal layer 101 made of Mo, Ta, W or Sb, an etch rate at the side wall of the lower metal layer 100 becomes greater than that of the upper metal layer 101.

Accordingly, a width of the upper electrode layer 101' is formed to be greater than that of the lower electrode layer 100', thereby generating an overhang 103 as shown in FIG. 3b.

Therefore, in this preferred embodiment, to remove the overhang 103, a dry etching process is further performed as shown in FIG. 3c. At this point, the dry etching process is an anisotropic etch where an etch rate is increased in proportion to a gas flow rate, the gas flow rate being properly adjusted to perform this process.

It is preferable to use $SF_6$ and $O_2$ as the etching gas. More preferably, the flow rate of the SF gas is adjusted to be about 50 to about 175 sccm (standard cubic centimeter per minute), while the $O_2$ gas is adjusted to be about 200 to about 600 sccm.

The patterned photoresist layer 102' is first etched and removed using the $O_2$ gas having the flow rate of about 200 to about 600 sccm. After this step, the upper electrode layer 100', which is exposed by etching the patterned photoresist 102', is anisotropically etched using the $SF_6$, thereby obtaining a step-shaped double-layered electrode layer where a width of the upper electrode layer 101' is less than that of the lower electrode layer 100'. This results in removal of the overhang.

As described above, since the double-layered electrode layer is designed such that a width of an upper pattern 104 is less than that of a lower pattern 100', an insulating layer 106 is uniformly deposited on the double-layered electrode layer, increasing the yield and quality of the semiconductor device.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A method of forming a double-layered electrode on a substrate comprising the steps of:

depositing lower and upper electrode layer forming materials on the substrate in order;

forming a patterned photoresist layer on the upper electrode layer forming material;

isotropically etching the lower and upper electrode layer forming materials while using the patterned photoresist layer as a mask, thereby obtaining lower and upper electrode layers;

removing the patterned photoresist layer; and then anisotropically etching the upper electrode layer such that a width of the upper electrode layer becomes less than that of the lower electrode layer.

2. The method of claim 1, wherein the lower electrode layer forming material is aluminum or an aluminum alloy.

3. The method of claim 1, wherein the upper electrode layer forming material is selected from the group consisting of Mo, Ta, W and Sb.

4. The method of claim 1, wherein the isotropic etching step is performed using an acidic aqueous solution comprising acetic acid, phosphoric acid, and nitric acid.

5. The method of claim 1, wherein the step of removing the photoresist is performed using an $O_2$ gas.

6. The method of claim 1, wherein the anisotropic etching step is performed using a $SF_6$ gas.

7. The method of claim 6 wherein a flow rate of the $SF_6$ gases is about 200 to about 600 sccm.

8. The method of claim 1, further comprising, after the step of forming the photoresist pattern, the step of heating the photoresist pattern such that a section of the patterned photoresist layer becomes substantially hemispherical.

9. A method of forming a double-layered electrode on a substrate comprising the steps of:

depositing lower and upper electrode layer forming materials on the substrate in order;

forming a patterned photoresist layer on the upper electrode layer forming material;

wet etching the lower and upper electrode layer forming materials simultaneously, thereby obtaining lower and upper electrode layers;

removing the patterned photoresist layer; and then dry etching the upper electrode layer such that a width of the upper electrode layer becomes less than that of the lower electrode layer.

10. The method of claim 9, wherein the wet etching step is performed using an acidic aqueous solution comprising acetic acid, phosphoric acid, and nitric acid.

11. The method of claim 9, wherein the dry etching step is performed using a $SF_6$ gas.

12. The method of claim 11, wherein a flow rate of the $SF_6$ gases is about 200 to about 600 sccm.

13. A method of forming a double-layered electrode on a substrate comprising the steps of:

depositing a first gate metal layer forming material and a second gate metal layer forming material on the substrate;

forming a photoresist layer on the second gate metal layer forming material;

etching the first and second gate metal layer forming materials while using the photoresist layer as a mask, thereby obtaining first and second gate metal layers;

removing the photoresist layer; and then etching the second gate metal layer such that a width of the second gate metal layer becomes less than that of the first gate metal layer.

14. The method of claim 13, wherein the step of etching the second gate metal layer is done using an anisotropical etching process.

15. The method of claim 13, wherein the first gate metal layer forming material is aluminum or an aluminum alloy.

16. The method of claim 13, wherein the second gate metal layer forming material is selected from the group consisting of Mo, Ta, W and Sb.

17. The method of claim 13, wherein the step of etching the first and second gate metal layer forming materials includes an isotropic etching process.

18. The method of claim 17, wherein the isotropic etching step is performed using an acidic aqueous solution comprising acetic acid, phosphoric acid, and nitric acid.

19. The method of claim 13, wherein the step of removing the photoresist is performed using an $O_2$ gas.

20. The method of claim 14, wherein the anisotropic etching step is performed using a $SF_6$ gas.

21. The method of claim 20, wherein a flow rate of the $SF_6$ gases is about 200 to about 600 sccm.

22. The method of claim 13, further comprising, after the step of forming the photoresist pattern, the step of heating the photoresist pattern such that a section of the patterned photoresist layer becomes substantially hemispherical.

\* \* \* \* \*

UNITED STATES PATENT AND TRADEMARK OFFICE
CERTIFICATE OF CORRECTION

PATENT NO. : 6,048,783
DATED : April 11, 2000
INVENTOR(S) : Kim et al.

It is certified that error appears in the above-identified patent and that said Letters Patent is hereby corrected as shown below:

Please insert category "[30] Foreign Application Priority Data" as follows:

-- [30]    Foreign Application Priority Data

September 1, 1998  [KR]  Korea ............. 1998-35816 --.

Signed and Sealed this

Tenth Day of April, 2001

Attest:

NICHOLAS P. GODICI

*Attesting Officer*    *Acting Director of the United States Patent and Trademark Office*